United States Patent [19]

Bethurum

[11] Patent Number: 5,546,278

[45] Date of Patent: Aug. 13, 1996

[54] IC CARD PROTECTIVE COVER

[75] Inventor: Gary C. Bethurum, Laguna Niguel, Calif.

[73] Assignee: ITT Corporation, New York, N.Y.

[21] Appl. No.: 168,101

[22] Filed: Dec. 15, 1993

[51] Int. Cl.$^6$ .............................. H05K 1/14; H05K 9/00; G06K 5/00

[52] U.S. Cl. .................... 361/737; 361/800; 361/818; 174/35 R; 235/380; 235/492

[58] Field of Search ...................... 361/736–737, 361/785, 816–818, 740, 752–753, 759, 796, 800; 174/35 R, 35 MS; 439/607–610; 235/380, 492

[56] References Cited

U.S. PATENT DOCUMENTS

| | | |
|---|---|---|
| 4,386,388 | 5/1983 | Beun . |
| 4,689,723 | 8/1987 | Myers et al. . |
| 4,838,422 | 6/1989 | Gregerson . |
| 4,924,076 | 5/1990 | Kitamura . |
| 4,929,195 | 5/1990 | Seidoh ............................. 439/610 |
| 5,124,888 | 6/1992 | Suzuki et al. . |
| 5,199,903 | 4/1993 | Asick et al. ..................... 439/610 |
| 5,207,586 | 5/1993 | MacGregor et al. ............ 439/76 |
| 5,242,310 | 9/1993 | Leung ............................. 439/76 |
| 5,330,360 | 7/1994 | Marsh et al. .................... 439/76 |
| 5,386,340 | 1/1995 | Kurz . |
| 5,414,253 | 5/1995 | Baudouin . |

FOREIGN PATENT DOCUMENTS 1270399 10/1989 Japan .
5013976 1/1993 Japan .

OTHER PUBLICATIONS

"A Packaging Solution for your Circuit" R&D Micro Inc. "New! One Piece PCMCIA Kits"; ELECTRONIC COMPONENT NEWS, Oct., 1993 issue.

Primary Examiner—Bot L. Ledynh
Attorney, Agent, or Firm—Freilich Hornbaker Rosen

[57] ABSTRACT

An IC card has a frame (14, FIG. 2) that protects the circuit board-and-connector assembly (12), wherein the frame is sturdy and of low cost and provides good EMI (electromagnetic interference) shielding. The frame includes lower and upper sheet metal shield halves (50, 52) each having large area sheets (60, 80) covering the bottom and top of the circuit board-and-connector assembly. The lower shield half has a pair of upstanding lower rails (70, 72) that extend along most of the length of each side, while the upper shield half has a pair of depending rails (86, 88) at its opposite sides that lie facewise against the outer surfaces of the lower rails. The lower ends (100, FIG. 4) of the upper rails are bent 90° to lie under the lower sheet, and the upper ends (112) of the lower rails abut the upper sheet. The circuit board and connector assembly is placed in the lower shield half, and the upper shield half is positioned with its rear end aligned with the front end of the lower shield half, with the upper shield half then being slid rearwardly to its final position.

5 Claims, 3 Drawing Sheets

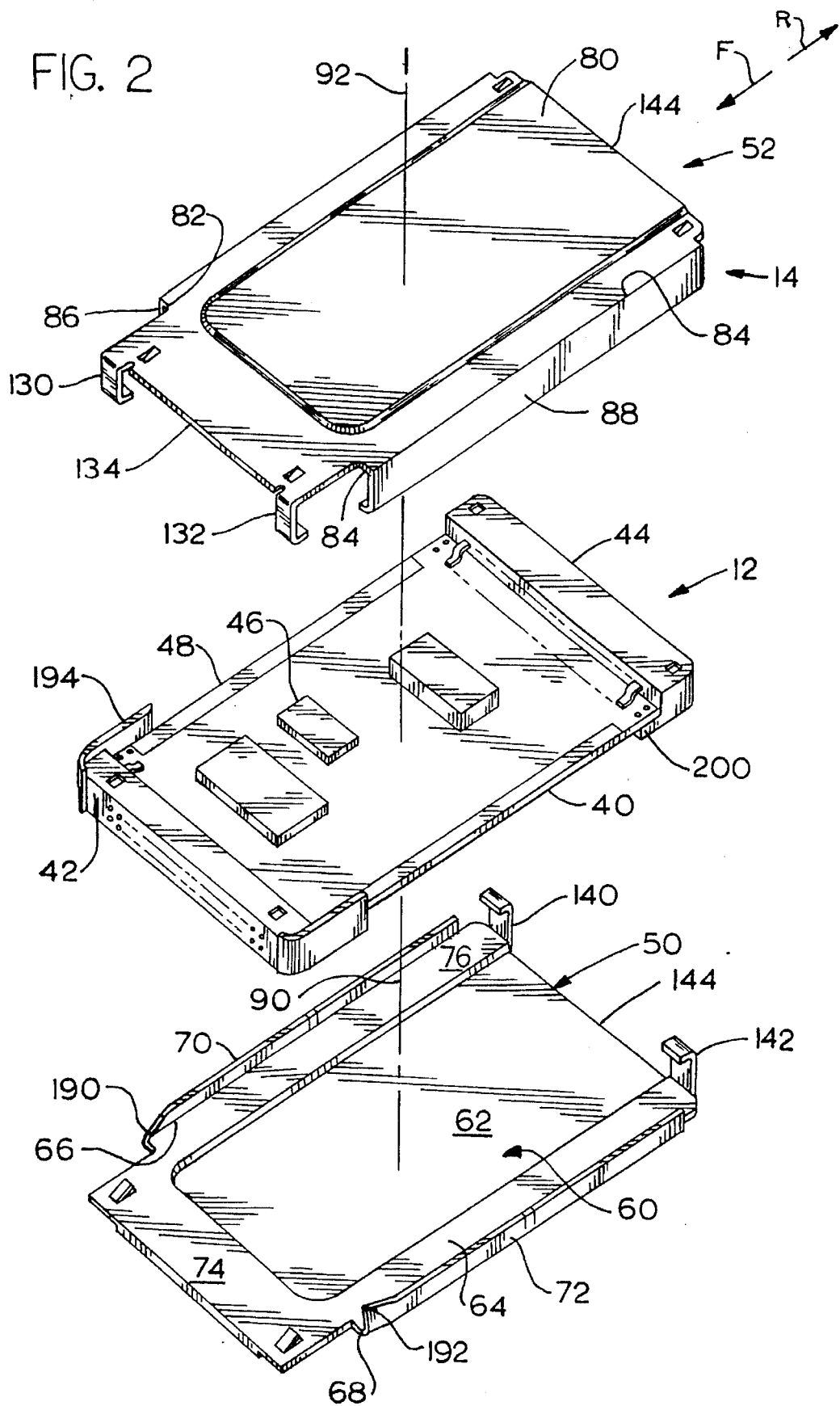

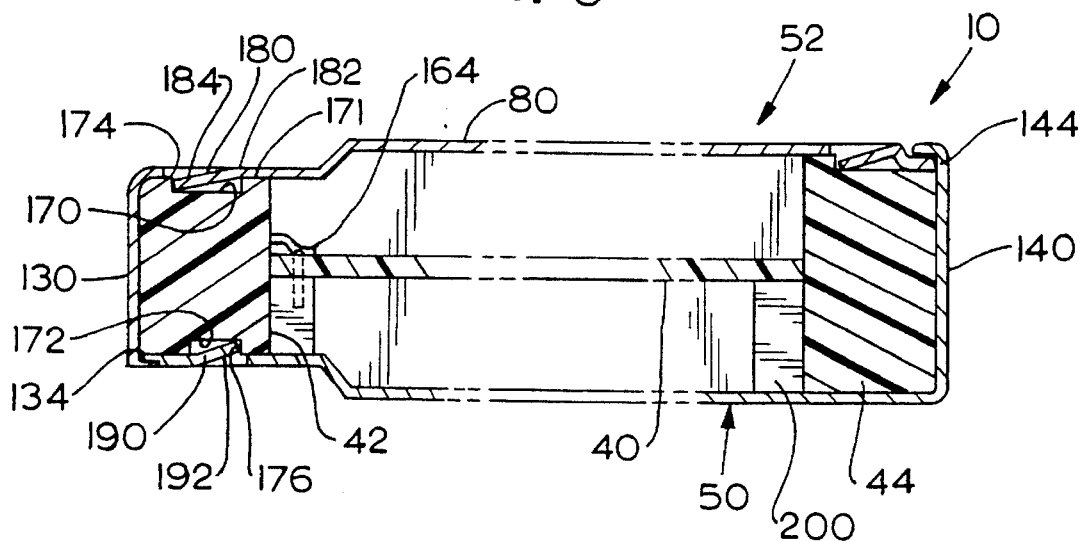
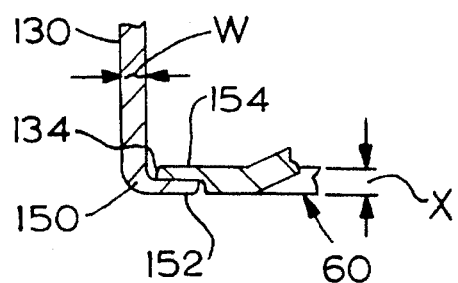
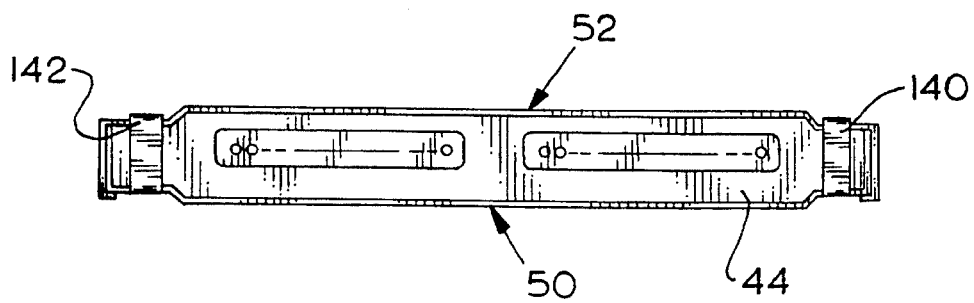

5,546,278

IC CARD PROTECTIVE COVER

BACKGROUND OF THE INVENTION

IC (integrated circuit) cards are often useful in electronic equipment of small thickness, such as lap top computers having the width and length of a sheet of notebook paper and a thickness of perhaps one centimeter. Standard JEIDA cards have a thickness of five millimeters, which enables them to be inserted into thin slots of the electronic device. IC cards are commonly constructed with a frame that includes a molded plastic body that has opposite side beams, and that also includes top and bottom metal covers for EMI (electromagnetic interference) shielding. A circuit board-and-connector assembly is mounted on the body. There are several disadvantages in the use of the above-described prior art frame that consists of the molded plastic body and top and bottom covers. One disadvantage is that adhesive is used to hold the covers to the body, but the covers tend to peel off. A frame for an IC card which could be constructed at low cost, which avoided the need for adhesive bonding of frame parts, and which provided enhanced EMI protection, would be of value.

SUMMARY OF THE INVENTION

In accordance with one embodiment of the present invention, a frame is provided for an IC card, which can be constructed at low cost and provide high reliability along with good EMI shielding. The frame includes lower and upper shield halves that can fit together around the circuit board and connector assembly, by placing the assembly on the lower shield half and then sliding the upper shield half rearwardly until the halves are in an aligned position. The lower shield half comprises a primarily horizontally-extending lower sheet and a pair of sides forming lower rails. The upper shield half comprises an upper sheet and a pair of vertical rails extending down from opposite sides of the upper sheet and slidably engaging the lower rails.

The lower rails extend vertically upwardly, with the extreme upper ends of the lower rails abutting the opposite sides of the upper sheet. The lower ends of the upper rails are bent about 90° to lie under opposite sides of the lower sheet. Upper portions of the lower rails can be offset so their extreme upper ends abut upper sheet locations spaced slightly inwardly of the top of the upper rails.

The novel features of the invention are set forth with particularity in the appended claims. The invention will be best understood from the following description when read in conjunction with the accompanying drawings.

BRIEF DESCRIPTION OF THE DRAWINGS

FIG. 2 is an exploded isometric view of the IC card of FIG. 1.

FIG. 5 is a partial sectional view taken on the line 5—5 of FIG. 1.

FIG. 6 is an enlarged view of a portion of the frame of FIG. 5.

FIG. 7 is a rear elevation view of the IC card of FIG. 1.

DESCRIPTION OF THE PREFERRED EMBODIMENT

Figure 1:
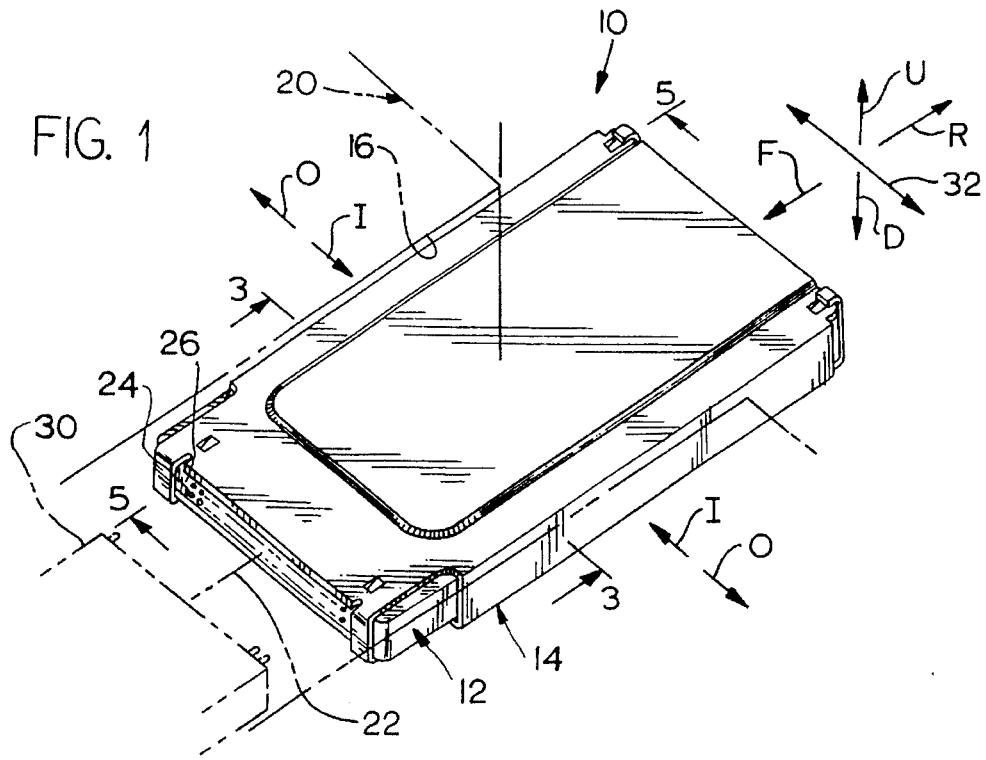
FIG. 1 is an isometric view of an IC card, and showing, in phantom lines, the card at an intermediate position during its insertion into a slot of an electronic device.

FIG. 1 illustrates an IC card 10 which includes a circuit board-and-connector assembly 12 which is surrounded by a frame 14. The IC card is used by inserting it in a forward direction F into a slot 16 of an electronic device 20 such as a lap top computer. The card is moved forwardly along a longitudinal axis 22 until contacts 24 of an IC card connector 26 mate with corresponding contacts of a connector 30 of the electronic device. FIG. 1 shows longitudinally-extending forward and rearward directions F, R, up and down directions U, D, and lateral directions 32 that are perpendicular to the other directions. Although terms such as "upper", "lower", "vertical" etc. will be used herein to help describe the relative positions of the parts as illustrated, it should be understood that the IC card can be used in any orientation with respect to gravity.

FIG. 2 shows the construction of the circuit board-and-connector assembly 12 which includes a circuit board 40 and front and rear connectors 42, 44, with the circuit board mounted on the connectors to form an assembly that can be handled as a unit. The circuit board has circuit components 46 connected to traces (not shown) on the board, and has a ground plane with peripheral ground plane portions 48. The frame includes a cover 49 formed by lower and upper shield halves 50, 52 that can be connected to each other to enclose the circuit board and connector assembly. The lower shield half 50 includes a lower sheet 60 extending primarily in a horizontal plane, the particular sheet having a large planer center portion 62 and a peripheral portion 64, with the sheet portions lying in spaced but parallel planes. The front and rear of the lower sheet form supporting walls 74, 76 for supporting connectors of the circuit board-and-connector assembly. The lower sheet has a pair of laterally spaced opposite sides 66, 68 that form first and second lower rails 70, 72.

The upper shield half 52 includes an upper sheet 80 with central and peripheral portions lying in spaced parallel planes, and has a pair of opposite sides 82, 84 forming first and second upper rails 86, 88. Each of the upper rails 86, 88 extends primarily vertically downwardly to the lower rails 70, 72. The upper rails are slidable in a longitudinal direction (F, R) along the lower rails. When the upper shield half has been slid to a fully installed position, or aligned position, the vertical axes 90, 92 of the lower and upper shield halves are aligned, with the circuit board-and-connector assembly 12 sandwiched between them.

Figure 3:
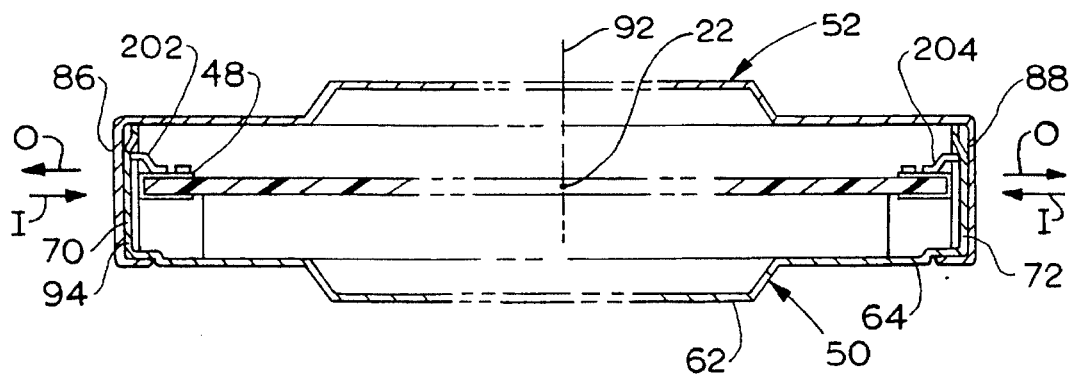
FIG. 3 is a partial sectional view taken on the line 3—3 of FIG. 1.

FIG. 3, which is taken on line 3—3 of FIG. 1, shows the manner in which the lower and upper shield halves are slidably connected. The lower rails 70, 72 lie inward of the outer rails 86, 88, with inward directions I being directions towards the vertical axes 90, 92 or a longitudinal plane in which the axes 90, 92 and longitudinal axis 22 lie. Similarly, the upper rails 86, 88 lie outward, in directions O, of the lower rails, with the rails lying substantially facewise against each other along at least about half of the height of the rails. That is, lower portions 94 of the lower rails lie facewise against the upper rails.

Figure 4:
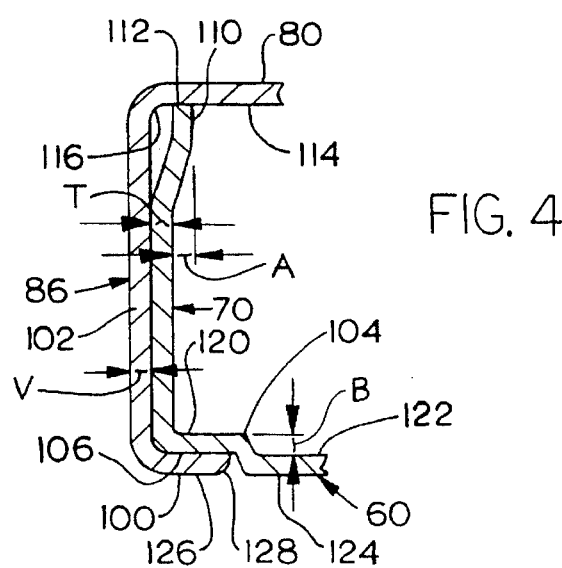
FIG. 4 is an enlarged view of one side of the frame of the IC card of FIG. 3.

As shown in FIG. 4, the upper rail 86 has a lower end or lower end part 100 that is bent about 90° from the major part 102 of the upper rail. As a result, the lower end 100 lies under a side portion 104 of the lower sheet 60 and against a downwardly-facing surface 106 thereat. The lower rail 70 has an upper end portion 110 with an extreme upper end 112 that substantially abuts the lower surface 114 of the upper sheet 80. The abutment of the lower end 100 of the upper rail against the lower sheet 60, and the abutment of the upper end of the lower rail against the upper sheet, results in large resistance of the frame against bending about a longitudinal axis 22 (FIG. 3). That is, if forces are applied to the frame that tend to twist it about the longitudinal axis 22, such twisting is resisted by the engagement of the lower and upper rails respectively with the upper and lower sheets. Although it is desirable for the extreme upper end 112 of the lower rail to abut the surface 114, resistance against bending is achieved even if there is a very small space between them, which is preferably not more than the average thickness T of the lower rail, such a gap sometimes being required to account for manufacturing tolerances while assuring that the upper shield can slide into position.

Applicant notes that the upper end portion 110 of the lower rail is offset a distance A from the lower portion of the lower rail. Such offsetting assures that the extreme upper end 112 of the lower rail will abut a substantially downwardly facing surface 114. Without such offset, the extreme upper end 112 will be likely to abut the rounded inside corner 116 which would detract from the rigidity of the frame.

Applicant notes that the side portion 104 of the lower sheet 60 has upper and lower parts 120, 122 which are offset a distance B which is approximately equal to the thickness V of the upper rail, at least at the part 100. Such offsetting results in the lower surface 124 of the lower part 122 being substantially flush with the lower surface 126 of the lower end 100. Such flushness minimizes the possibility of the extreme edge 128 of the upper rail lower part 100 catching on parts in the environment when it is transported and stored.

FIG. 2 shows that the upper shield half 52 has a pair of stop arms 130, 132 at its front end 134. Similarly, the lower shield half 50 has a pair of stop arms 140, 142 at its rear end 144. The stop arms limit rearward movement of the upper shield half 52 when it is slid longitudinally along the lower shield half 50 during assembly. FIG. 5 shows the assembled IC card 10, showing stop arm 130 of the upper shield half abutting the front end 134 of the lower shield half, and the stop arm 140 of the lower shield half abutting the rear end 144 of the upper shield half. As shown in FIG. 6, the arm 130 has a 90° bend 150 which results in the lower end forming a hook 152 that lies against an end part 154 of the lower sheet 60. Applicant avoids a projection at the bottom of the IC card, by forming both the hook 52 and end part 54 so they have about half the thickness W, X of the arm 130 and of the sheet 60. It would be possible to instead bend up the end part, in the manner shown at the bottom of FIG. 4, but this has the disadvantage that it creates a raised lower surface on which a front connector of the circuit board assembly must rest.

FIG. 5 shows the front and rear connectors 42, 44 lying at the front and rear ends of the circuit board 40. The front connector 42 has multiple contacts with tail ends 164 that are soldered to conductive traces at the front of the circuit board. Applicant prefers to form recesses 170, 172 at upper and lower surface regions 171, 173 of the front connector 160. The recesses form a rearwardly-facing shoulder 174 at the upper recess, and a forwardly-facing shoulder 176 at the lower recess. The upper sheet 80 has tines 180 with rearward locations 182 merging with the rest of the sheet, and with free forward ends 184. The free forward ends 184 abut the connector shoulder 174. As a result, when the upper shield half 52 has been slid to its aligned position shown in FIG. 5, the tine 180 prevents forward movement of the upper shield part. In a similar manner, the lower shield part has a tine 190 with a free rearward end 192 that abuts the connector shoulder 176. As a result, the tine prevents the connector 42 from moving forwardly and thereby prevents the upper shield half from moving forwardly with respect to the lower shield half. The tines can be lifted by special tools to enable repair of an IC card. Similar tines and recesses can be provided in the upper and/or lower surfaces of the rear connector 44.

FIG. 2 shows that the lower rails 70, 72 of the lower shield half have forward ends 190, 192 that are bent inwardly. This bending provides a "lead in" that facilitates sliding engagement of the upper shield half with the lower one as the upper shield half is slid rearwardly into position. It is noted that the circuit board assembly 12 has polarizing projections 194, which prevent installation of the circuit board assembly in an upside down position within the frame.

The lower and upper shield halves are each formed of a piece of sheet metal such as stainless steel, with various parts bent as shown. The circuit board-and-connector assembly 12 is installed on the lower shield half 50 by moving it downwardly onto the lower shield half. The upper shield half 52 is then positioned with its rear end 144 in front of the lower shield half and the circuit board-and-connector assembly, and the upper shield half is slid rearwardly into its final position wherein the rear ends of the shield halves are about even.

The circuit board 40 of the circuit board-and-connector assembly, is supported at its opposite ends, on ledges 200 of the connectors. Pairs of upstanding projections 210 212 on the rear connector 44 are received in circuit board holes 214 at a rear end portion 216 of the circuit board. Similarly, projections 220 on the front connector 42 are received in holes at the front end portion of the circuit board. Each row of contact tails such as 164, 165 of each connector, extends in a lateral direction 32, and the projections such as 210, 212 lie laterally beyond each row of contacts. Only the connectors 42, 44 are mounted on the frame, by being trapped between the upper and lower shield halves 50, 52 of the cover 49. Thus, both the circuit board 40 and cover 49 are rigidly mounted on the connectors. Applicant prefers to electrically connect the frame formed by the shield halves, to the peripheral ground plane portions 48, by forming tabs such as 202, 204 in FIG. 3 in the lower rails which are bent over and soldered to the ground plane after the circuit board-and-connector assembly is placed in the lower shield half.

Thus, the invention provides an IC frame for an IC card, which can be constructed at low cost, and which is rigid and reliable. The frame includes lower and upper sheet metal shield halves, with each having rails at its side and with the rails of the upper and lower shield halves being engaged to enable longitudinal sliding of the upper shield half with respect to the lower half. The lower rails have upper ends abutting the lower surfaces of the upper sheet, while the upper rails have lower ends bent about 90° to lie under the lower surface of the lower sheet. Offsetting or thinning can be used to avoid a projecting edge portion. Although applicant shows the lower rails lying inward of the upper ones, it is possible to have the lower rails lying outward of the upper ones.

Although particular embodiments of the invention have been described and illustrated herein, it is recognized that modifications and variations may readily occur to those skilled in the art, and consequently, it is intended that the claims be interpreted to cover such modifications and equivalents.

I claim:

1. An IC card that includes a circuit board assembly which comprises a circuit board that has front and rear end portions and laterally spaced opposite sides and upper and lower surfaces, front and rear connectors that lie respectively at said front and rear end portions of said circuit board with each of said connectors having laterally spaced opposite sides and with each connector having a row of contacts, and a cover that includes upper and lower sheet-like parts that lie respectively above and below said circuit board, characterized by:

said front and rear end portions of said circuit board are mounted respectively on said front and rear connectors at locations spaced from the row of contacts of the corresponding connector;

said front and rear connectors each have upper and lower faces, and said cover is mounted directly on both of said faces of each of said front and rear connectors, and said cover is substantially free of rigid connection to said circuit board independently of said connectors.

2. The IC card described in claim 1 wherein:

said connectors are substantially rigidly connected together only by said circuit board and said cover.

3. An IC card frame for receiving and shielding a circuit board and connector assembly that includes a circuit board having laterally-spaced opposite board sides and longitudinally-spaced front and rear ends, and that also includes at least one connector coupled to an end of said board, characterized by:

lower and upper sheet metal shield halves having coincidental vertical axes, said lower sheet metal shield half comprising a lower sheet having opposite sides and a pair of lower rails extending upwardly at said sides, and said upper sheet metal shield half comprising an upper sheet having opposite sides and a pair of upper rails extending downwardly at said sides thereof and lying outward of and substantially against said lower rails, with said upper rails having lower ends bent inwardly to lie under said lower shield sides;

said upper sheet has a lower surface, and said lower rails have upper ends each forming an edge of said sheet, with each of said edges substantially abutting said lower surface of said upper sheet.

4. An IC card frame for receiving and shielding a circuit board and connector assembly that includes a circuit board having laterally-spaced opposite board sides and longitudinally-spaced front and rear ends, and that also includes at least one connector coupled to an end of said board, characterized by:

lower and upper shield halves having coincidental vertical axes, said lower shield half comprising a lower sheet having opposite sides and a pair of lower rails extending upwardly at said sides, and said upper shield half comprising an upper sheet having opposite sides and a pair of upper rails extending downwardly at said sides thereof and lying outward of said lower rails, with said upper rails having lower ends bent inwardly to lie under said lower shield sides;

said upper rails have upper ends each forming a substantially 90° bend where said upper rails begins to extend downwardly;

said upper sheet has a lower surface, and said lower rails have upper ends substantially abutting said lower surface of said upper sheet, with said lower rails having lower portions lying facewise against said upper rails, and said lower rails have upper portions that are offset inwardly of said lower portions, so the extreme upper ends of the lower rails lie inward of said bends to abut said upper sheets at locations spaced slightly inwardly from said upper rails.

5. An IC card comprising:

a sheet metal lower shield half having a lower sheet with opposite sides and longitudinally spaced front and rear ends, said lower shield half having upstanding side rails at said sides wherein each rail extends longitudinally along the corresponding side;

a circuit board-and-connector assembly lying at supporting walls, said assembly including front and rear connectors lying respectively at front and rear ends of said lower sheet and a circuit board extending between said connectors;

a sheet metal upper shield half having an upper sheet lying over said assembly and said lower sheet, with said upper sheet having opposite sides and with said upper shield half having depending upper rails at said opposite sides thereof, wherein each of said upper rails extends longitudinally along the corresponding upper sheet side, said upper rails lying outward of and substantially against said lower rails and being slidably longitudinally thereon;

said connectors have upper and lower surface regions, wherein at least one of said upper surface regions forms an upper recess with a rearwardly-facing shoulder;

said upper sheet forms a tine with a free forward end lying in said upper recess and substantially against said rearwardly-facing shoulder.

* * * * *